(12) United States Patent
Wada

(10) Patent No.: US 7,911,249 B2
(45) Date of Patent: Mar. 22, 2011

(54) SEMICONDUCTOR INTEGRATED CIRCUIT

(75) Inventor: Toru Wada, Osaka (JP)

(73) Assignee: Panasonic Corporation, Osaka (JP)

(*) Notice: Subject to any disclaimer, the term of this patent is extended or adjusted under 35 U.S.C. 154(b) by 204 days.

(21) Appl. No.: 11/826,571

(22) Filed: Jul. 17, 2007

(65) Prior Publication Data
US 2008/0024181 A1 Jan. 31, 2008

(30) Foreign Application Priority Data
Jul. 25, 2006 (JP) .................... 2006-201781

(51) Int. Cl.
*H03K 5/135* (2006.01)
*H03K 5/22* (2006.01)
*H03L 7/00* (2006.01)
(52) U.S. Cl. ............... 327/262; 327/161; 327/538
(58) Field of Classification Search .............. None
See application file for complete search history.

(56) References Cited

U.S. PATENT DOCUMENTS

| 6,172,544 | B1* | 1/2001 | Sugamori ............ 327/263 |
| 6,242,954 | B1* | 6/2001 | Taniguchi et al. ...... 327/149 |
| 6,603,363 | B1* | 8/2003 | Yamaoka et al. ....... 331/57 |
| 7,218,158 | B2* | 5/2007 | Kim .................... 327/158 |
| 7,319,349 | B2* | 1/2008 | Tomita ................ 327/144 |
| 2005/0060676 | A1 | 3/2005 | Matsumura et al. |
| 2006/0179376 | A1 | 8/2006 | Asaka |

FOREIGN PATENT DOCUMENTS
JP 2004-165649 6/2004

* cited by examiner

*Primary Examiner* — Lincoln Donovan
*Assistant Examiner* — Terry L Englund
(74) *Attorney, Agent, or Firm* — McDermott Will & Emery LLP

(57) ABSTRACT

A combinational circuit is connected to a flip-flop circuit. A clock buffer supplies a clock to the flip-flop circuit. A control circuit controls a delay time of the flip-flop circuit and a delay time of the combinational circuit independently.

19 Claims, 9 Drawing Sheets

F I G. 1
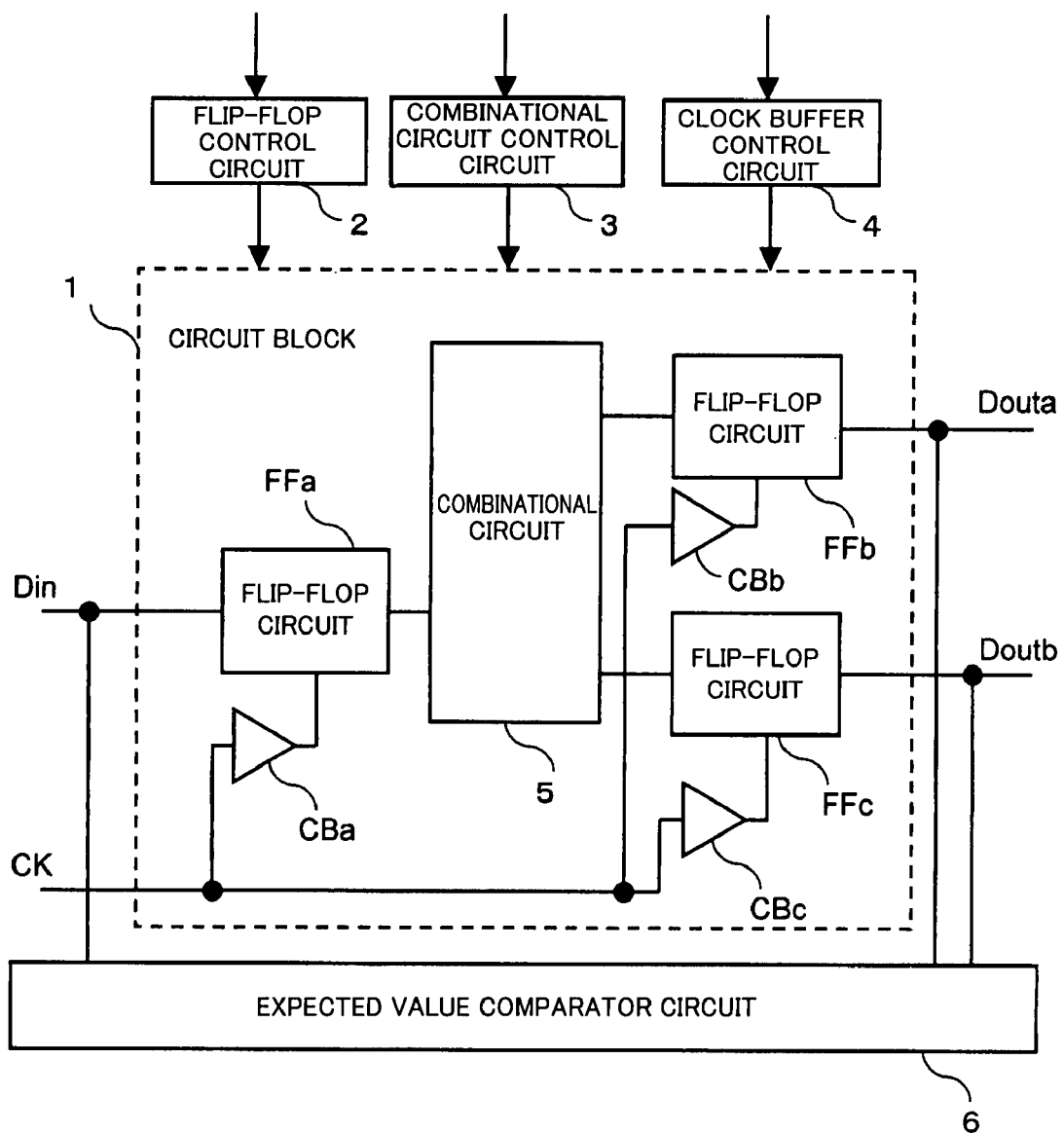

F I G. 2
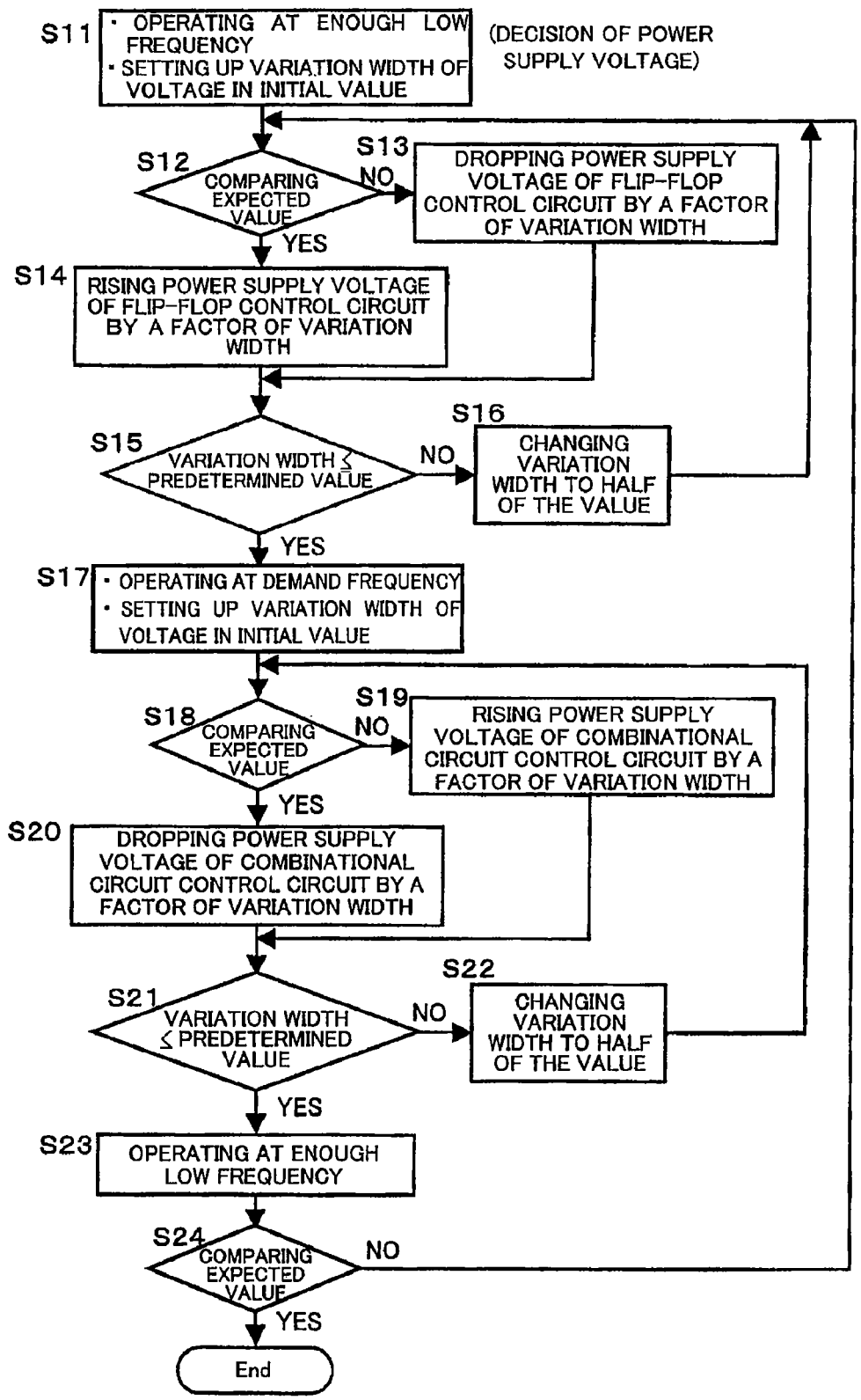

F I G. 3
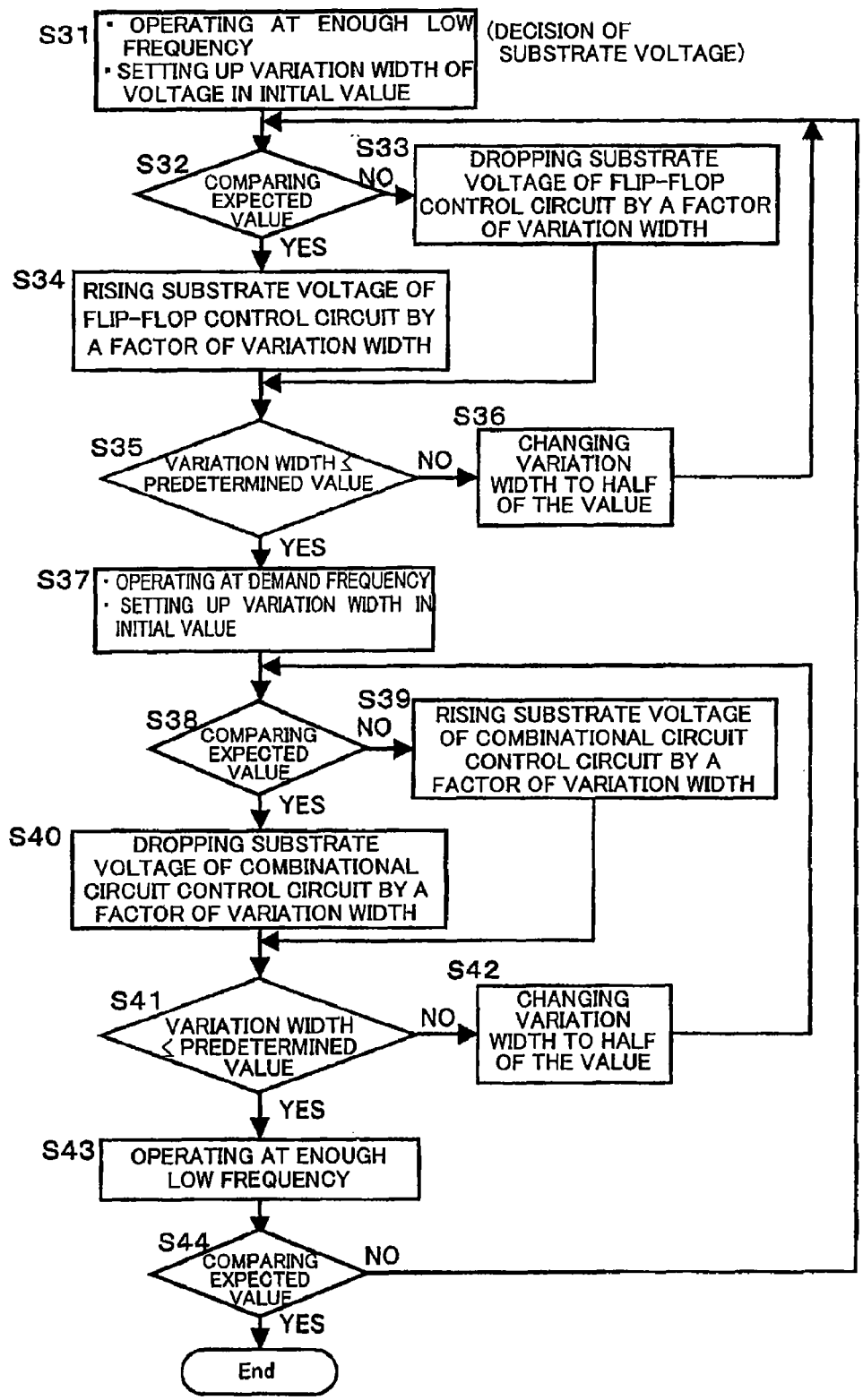

F I G. 1 0
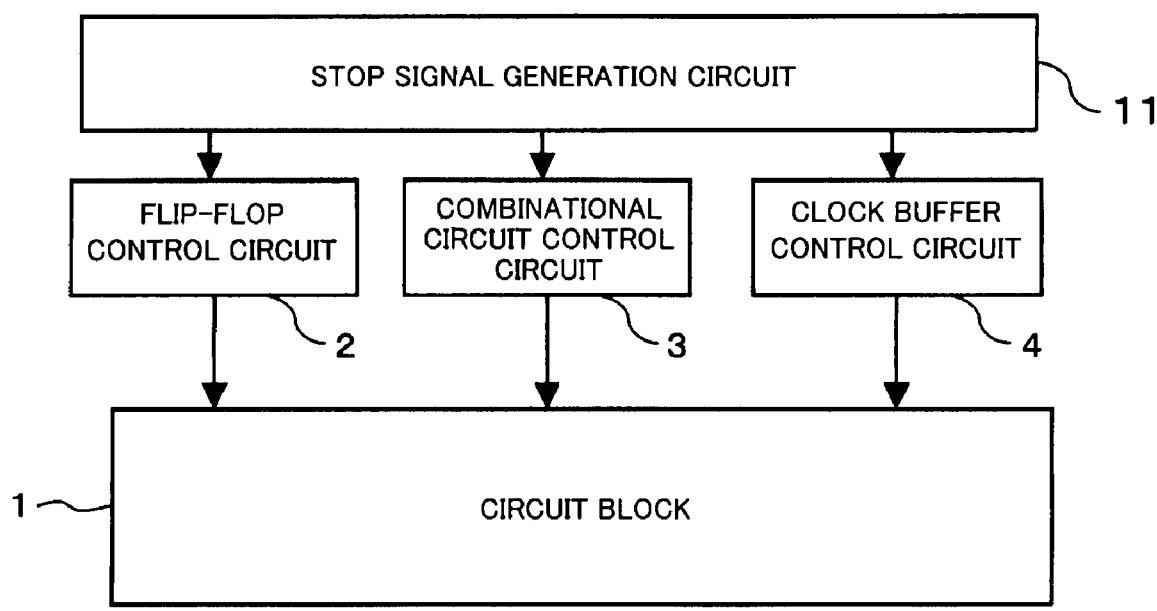

SEMICONDUCTOR INTEGRATED CIRCUIT

BACKGROUND OF THE INVENTION

1. Field of the Invention

The present invention is related to a semiconductor integrated circuit, and in particular, relates to a technique to control an influence due to a process variation, that become remarkable in micro fabrication, generated at random between plural MOSFETs.

2. Description of the Related Art

In recent years, based on advancement of a micro process to the fabrication of a semiconductor integrated circuit device, the semiconductor integrated circuit device has been fabricated in the process where the channel-length of MOSFET is below 0.1-micron order. Along with such miniaturisation in the process, the characteristic variation based on an environmental temperature and the process variation becomes remarkable. On the other hand, the following reports are performed with respect to the above situation.

That is, as a technique that controls the above-mentioned characteristic variation, there is a method of constantly controlling an electric current between a source and a drain of the MOSFET of a P-type and an N-type by the substrate voltage as shown in a Japanese publication patent document (Japanese Patent Application Laid-open No. 2004-165649). According to this variation inhibition technique, the drain current of the MOSFET (in particular, the drain current in an arbitrary gate voltage value of a sub-threshold region or a saturation region) can be controlled so that there are neither a temperature dependency nor a process variation dependency, and the improvement of an operational stability can be achieved.

However, in the semiconductor manufacturing technique, although the process variation (Hereafter, it is called "random variation") generated at random between the plural MOSFETs becomes remarkable along with miniaturisation, it is difficult to control the characteristic variation depending on such a random variation according to the above-mentioned conventional technique for controlling the variation. For example, in the path to decide an operation frequency, a delay time grows due to the random variation, and a setup error is occurred. Moreover, in the path where the holding restriction of flip-flop is severe, the delay time decreases by the random variation, and a holding error is occurred. For this case, it is impossible to avoid both errors at the same time according to the above-mentioned conventional technique for controlling the variation.

SUMMARY OF THE INVENTION

Therefore, the main object of the present invention is to achieve the improvement of the operational stability even if the random variation is occurred.

The present invention has the following configuration in order to achieve the above-mentioned object.

(i) A semiconductor integrated circuit according to the present invention includes:
  one or more flip-flop circuits;
  one or more combinational circuits connected to the flip-flop circuit;
  one or more clock buffers for supplying a clock to the flip-flop circuit; and
  a control circuit for controlling a delay time of the flip-flop circuit and a delay time of the combinational circuit mutually and independently.

According to this configuration, even when the delay time becomes short or long locally by the random variation included in the semiconductor integrated circuit consisting of MOSFET etc., it is possible to control the characteristic variation that depends on the above-mentioned random variation becomes possible through controlling the delay time of the flip-flop circuit and the delay time of the combinational circuit independently. Herewith, the improvement of the operational stability of the semiconductor integrated circuit can be achieved.

(ii) In the above-mentioned configuration, there is an embodiment that the control circuit controls the delay time of the flip-flop circuit so that the aforementioned delay time becomes long, when an operation result in a state where the flip-flop circuit and the combinational circuit are operated at enough low frequency from the clock frequency is different from an expected value. Herewith, even in the situation where there is a possibility that the error in the enough low frequency from the requested operation frequency, that is, the holding error is occurred, it is possible to avoid the holding error by adjusting the delay time of the flip-flop circuit. Here, the enough low frequency described here is as for the frequency of $\frac{1}{10}$ less or equals of the requested operation frequency.

(iii) In the above-mentioned configuration, there is an embodiment that the control circuit controls the delay time of the flip-flop circuit so that the aforementioned delay time becomes short, when an operation result in a state where the flip-flop circuit and the combinational circuit are operated at the clock frequency is different from an expected value. Herewith, even in the situation where there is a possibility that the error in the requested operation frequency, that is, the setup error is occurred, it is possible to avoid the setup error by adjusting the delay time of the combinational circuit.

(iv) In the above-mentioned configuration, there is an embodiment that the control circuit controls the delay time through control of a substrate voltage. Herewith, the delay time of the circuit where the error is occurred can be controlled to a proper value.

(v) In the above-mentioned configuration, there is an embodiment that the control circuit controls the delay time by through control of a power supply voltage. Herewith, the delay time of the circuit where the error is occurred can be controlled to a proper value.

(vi) In the above-mentioned configuration, there is an embodiment that:
  a first circuit row, a second circuit row and a third circuit row arranged in parallel with one another sequentially are incorporated;
  the flip-flop circuit is provided in the first circuit row;
  the combinational circuit is provided in the second circuit row; and
  the clock buffer is provided in the third circuit row. Herewith, since the power supply wiring and substrate wiring can be carried out in an optimal state, it is possible to achieve the reduction of resistance and the minimization of the wiring resource.

(vii) In the above-mentioned configuration, there is an embodiment that a temperature detecting circuit is further provided to adjust the control circuit according to a variation of a circuit temperature of aforementioned semiconductor integrated circuit is included. Herewith, the optimal delay time control in response to temperature fluctuation can be achieved even during operating.

(viii) In the above-mentioned configuration, there is an embodiment that a voltage detecting circuit for adjusting the control circuit according to an amount of voltage alteration of aforementioned semiconductor integrated circuit is further provided. Herewith, the optimal control of delay time in response to the voltage alteration can be achieved even during operating.

(ix) In the above-mentioned configuration, there is an embodiment that a monitor circuit for adjusting the control circuit so that an amount of a current of aforementioned semiconductor integrated circuit is constant is further provided. Herewith, the optimal control of delay time can be achieved through monitoring the amount of the current even during operating.

(x) In the above-mentioned configuration, there is an embodiment that a replica circuit for adjusting the control circuit so that a delay time of aforementioned semiconductor integrated circuit is constant is further provided. Herewith, the optimal control of delay time in response to change of the delay time can be achieved even during operating.

(xi) In the above-mentioned configuration, there is an embodiment that a stop signal generation circuit for controlling the control circuit so that a negative substrate voltage is applied to aforementioned flip-flop circuit when the flip-flop circuit gets into stop operation is further provided. Herewith, power consumption can be reduced while holding the value of the flip-flop circuit.

(xii) In the above-mentioned configuration, there is an embodiment that a stop signal generation circuit for controlling the control circuit so that an earth potential is applied to a power supply voltage of aforementioned combinational circuit and a power supply voltage of aforementioned clock buffer when the combinational circuit and the clock buffer get into stop operation, is further provided. Herewith, it is possible to reduce the power consumption in the state where operation is stopped.

As mentioned above, according to the present invention, the local variation and the like of delay time due to the random variation of the semiconductor integrated circuit consisting of MOSFET etc. can be prevented through controlling the delay time of the flip-flop circuit and the delay time of the combinational circuit independently. Herewith, the operational stability of the semiconductor integrated circuit is improved. More specifically, it is possible to avoid the holding error by adjusting the delay time of the flip-flop circuit. Moreover, it is also possible to avoid the setup error by adjusting the delay time of the combinational circuit.

Even when the local variation of the delay time due to the random variation of the semiconductor integrated circuit consisting of MOSFET etc. occurs, the technique of the present invention is useful as the semiconductor integrated circuit since it is possible to perform the stable operation by avoiding the holding error and the setup error.

BRIEF DESCRIPTION OF THE DRAWINGS

The objects of the invention other than this will be clear by understanding the embodiments described later, and it is clearly specified in the attached claims. And, if this invention is implemented, those skilled in the art will appreciate a lot of profits that do not touch in this specification by implementing the invention.

FIG. 1 is a block diagram showing a configuration of a semiconductor integrated circuit according to a first embodiment of the present invention;

FIG. 2 is a flow chart of process for deciding a power supply voltage according to a first embodiment of the present invention;

FIG. 3 is a flow chart of process for deciding a substrate voltage according to a first embodiment of the present invention;

FIG. 10 is a block diagram showing a configuration of a semiconductor integrated circuit according to a sixth embodiment of the present invention;

DETAILED DESCRIPTION OF THE INVENTION

Figure 4:
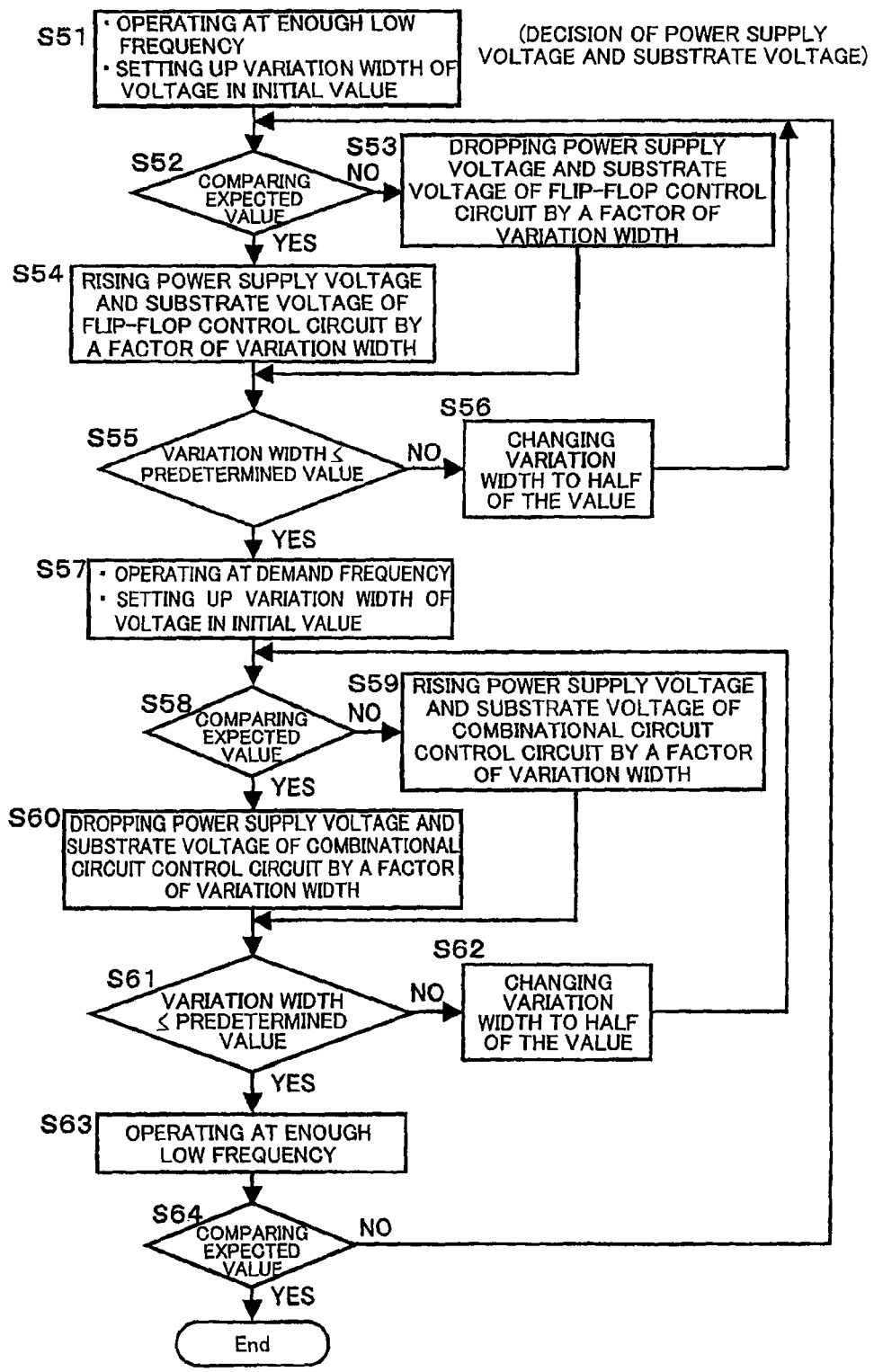
FIG. 4 is a flow chart of process for deciding the power supply voltage and the substrate voltage according to a first embodiment of the present invention.

Hereafter, the embodiments of the semiconductor integrated circuit according to the present invention is explained in detail on the basis of the drawings.

First Embodiment

FIG. 1 is a block diagram showing a configuration of a semiconductor integrated circuit according to the first embodiment of the present invention. As shown in FIG. 1, the semiconductor integrated circuit includes a circuit block 1, a flip-flop control circuit 2, a combinational circuit control circuit 3, a clock buffer control circuit 4, and an expected value comparator circuit 6. The circuit block 1 includes a data input terminal Din, data output terminals Douta and Doutb, a clock input terminal CK, clock buffers CBa, CBb and CBc that distributes a clock, flip-flop circuits FFa, FFb and FFc that are sequential circuits for holding value, and a combinational circuit 5 that is a logic gate such as AND and OR etc. The flip-flop control circuit 2 controls a power supply voltage and a substrate voltage of the flip-flop circuits FFa, FFb and FFc. The combinational circuit control circuit 3 controls the power supply voltage and the substrate voltage of the combinational circuit 5. The clock buffer control circuit 4 controls the power supply voltage and the substrate voltage of the clock buffers CBa, CBb and CBc. In addition, the number of the data input terminal and the number of the data output terminals are arbitrary. Furthermore, the power supply voltage means one or both of the voltage applied to the source of PMOS and the voltage applied to the source of NMOS. To enlarge the power supply voltage to the positive direction is to enlarge the voltage between the source and the drain of MOS, and to enlarge the power supply voltage to the negative direction is to reduce the voltage between the source and the drain of MOS. Further, the substrate voltage means one or both of the voltage applied to the substrate of PMOS and the voltage applied to the substrate of NMOS. To enlarge the power supply voltage to the positive direction is to change the voltage into the positive direction in the case of PMOS, and to change the voltage into the negative direction in the case of NMOS. To enlarge the power supply voltage to the negative direction is to change the voltage into the negative direction in the case of PMOS, and to change the voltage into the positive direction in the case of NMOS.

The flip-flop circuits FFa, FFb and FFc are the circuits controlled by the rising edge of the clock. Here, the delay time when an output signal changes after a definite period of time from the rising edge of the clock is defined as CKQ delay time. Furthermore, in order to realize a normal operation, it is necessary to decide a definite-period-of-time value before/after the rising timing of the clock. The minimum time at the time that should be decided before the rising timing of this clock is defined as a setup restriction value, and the minimum time at the time that should be decided after the rising timing of this clock is defined as a hold restriction value.

When a positive substrate voltage (forward bias) is applied to the flip-flop circuits FFa, FFb and FFc, compared with the case to apply a negative substrate voltage (back bias), the characteristic thereof is given as follows. That is, in this case, the CKQ delay time shortens more, and the setup restriction value and the hold restriction value become smaller, as the substrate voltage becomes larger to the positive direction. In addition, the flip-flop controlled by a falling edge of the clock can be used in place of the flip-flop circuit controlled by a rising edge of the clock.

Moreover, when a positive substrate voltage (forward bias) is applied to the combinational circuit 5, compared with the case to apply a negative substrate voltage (back bias), the characteristic thereof is given as follows. That is, in this case, the delay time of until the output changes after the input changes shortens more as the substrate voltage becomes larger to the positive direction. The flip-flop control circuit 2, the combinational circuit control circuit 3 and the clock buffer control circuit 4 have a nonvolatile memory etc. internally, and decide the substrate voltage based on information stored in the memory to outputs it outside. In addition, it may be constituted so that this memory the composition arranged not to the inside of the circuit block but to the outside of the circuit block.

The expected value comparator circuit 6 implements an operation that receives data from the data output terminals Douta and Doutb after outputting data to the data input terminal Din, and determines whether the operation of the circuit is normal by comparing both data (Hereafter, it is called "expected value comparing"). Although the expected value comparator circuit 6 is arranged in the semiconductor integrated circuit, it may be constituted so as to arrange it outside of the semiconductor integrated circuit is acceptable.

Next, the method for deciding a control voltage of the flip-flop control circuit 2 and the combinational circuit control circuit 3 is explained. It is preferable that the decision of this control voltage may be implemented in performing delivery inspection to the semiconductor integrated circuit after completion of the fabrication process.

(a) Optimizing Treatment of Power Supply Voltage

FIG. 2 is a flow chart of processing for deciding the power supply voltage supplied with the flip-flop control circuit 2 and the combinational circuit control circuit 3 in the semiconductor integrated circuit of the configuration shown in FIG. 1.

(a-1) Processing for Optimizing Power Supply Voltage of Flip-flop Control Circuit 2 in Order to Avoid Holding Error First of all, in step S11, after it sets up the power supply voltage, that the flip-flop control circuit 2, the combinational circuit control circuit 3 and the clock buffer control circuit 4 output, to a standard value that is inherent in the use process, these circuits 2, 3 and 4 output the substrate voltage of 0 as an output substrate voltage, that is, the same voltage value as the power supply voltage. Moreover, the width of voltage fluctuations (Hereafter, it is called "variation width ($2_1$)") in controlling the power supply voltage (Hereafter, it is called "power supply voltage (2)"), that the flip-flop control circuit 2 outputs by the variation adjustment that describes later, is reset to an initial variation width ($2_1$). The initial variation width ($2_1$) is set to the enough high value compared with the voltage fluctuation of the power supply voltage (2) at the time when the flip-flop control circuit 2 performs the stable operation. In order to detect the holding error in this state, the expected value comparator circuit 6 controls the circuit block 1 so that the signal processing operation of the circuit block 1 is implemented at the enough lower frequency more than the operation frequency requested in circuit block 1.

Next, in step S12, the expected value comparator circuit 6 compares the expected values. Here, the expected value comparing indicates processing that compares the expected value requested as the output value of the circuit block 1 in the design and the value output from the output terminals Douta and Doutb of the flip-flop circuits FFb and FFc. When the expected value comparator circuit 6 determines that the output value of the output terminals Douta and Doutb is not as the expected value, it goes to step S13, and the power supply voltage (2) is changed into a negative direction by a factor of variation width ($2_1$). On the other hand, when the expected value comparator circuit 6 determines that the output value of the output terminals Douta and Doutb is as the expected value, it goes to step S14, and the power supply voltage (2) is changed into a positive direction by a factor of variation width ($2_1$). The variation width ($2_1$) becomes the initial variation width ($2_1$) at the first stage of the control.

Next, in step S15, it is determined whether or not the variation width ($2_1$) used in the processing of steps S13 and S14 is less than or equal to the predetermined value ($2_1$). Here, the predetermined value ($2_1$) indicates the reference value for determining whether the variation width ($2_1$) is convergent or not as a result that the adjustments of the power supply voltage (2) progresses and then the power supply voltage (2) is stabilized.

In step S15, when it is determined that the variation width ($2_1$) is not less than or equal to the predetermined value ($2_1$), then, the variation width ($2_1$) is changed to half of the value in step S16.

Such expected value comparing flow is repeatedly executed until the variation width ($2_1$) becomes less than or equal to the predetermined value ($2_1$). Herewith, the power supply voltage (2) is set up as an optimal value where the holding error is not occurred.

(a-2) Processing for Optimizing the Power Supply Voltage of the Combinational Circuit Control Circuit 3 for Avoiding Setup Error Next, in step S17, the power supply voltage and the substrate voltage, that the flip-flop control circuit 2, the combinational circuit control circuit 3, and the clock buffer control circuit 4 output, are set up as the value (power supply voltage (2)) decided by the above-mentioned processing (a-1). Moreover, the width of voltage fluctuations (Hereafter, it is called "variation width ($3_1$)") in controlling the power supply voltage (Hereafter, it is called "power supply voltage (3)") that the combinational circuit control circuit 3 outputs through the variation adjustment described later is reset as an initial variation width ($3_1$). The initial variation width ($3_1$) is set as the enough high value compared with the voltage magnitude of the power supply voltage (3) when the combinational circuit control circuit 3 performs the stable operation. The expected value comparator circuit 6 controls the circuit block 1 so that the signal processing operation is implemented with the frequency equal to the operation frequency demanded in the circuit block 1 in this state.

Next, in step S18, the expected value comparator circuit 6 compares the expected values. Here, the expected value comparing is processing similar to the above-mentioned expected value comparing. When the expected value comparator circuit 6 determines that the output value of the output terminals Douta and Doutb is not as the expected value, it goes to step S19, and the power supply voltage (3) is changed into a negative direction by a factor of variation width ($3_1$). On the other hand, when the expected value comparator circuit 6 determines that the output value of the output terminals Douta and Doutb is as the expected value, it goes to step S20, and the power supply voltage (3) is changed into a positive direction by a factor of variation width ($3_1$). The variation width ($3_1$) becomes the initial variation width ($3_1$) at the first of the control.

Next, in step S21, it is determined whether or not the variation width ($3_1$) used in the processing of steps S19 and S20 is less than or equal to the predetermined value ($3_1$). Here, the predetermined value ($3_1$) indicates the reference value for determining whether the variation width ($3_1$) is convergent as a result that the adjustments of the power supply voltage (3) progresses and then the power supply voltage (3) is stabilized.

In step S21, when it is determined that the variation width ($3_1$) is not less than or equal to the predetermined value ($3_1$), next, the variation width ($3_1$) is changed to half of the value in step S22.

Such expected value comparing flow is repeatedly executed until the variation width ($3_1$) becomes less than or equal to the predetermined value ($3_1$). Herewith, the power supply voltage (3) is set up as the optimal value where the setup error is not occurred in the demanded operation frequency.

(a-3) Next, in step S23, the power supply voltage and the substrate voltage, that the flip-flop control circuit 2, the combinational circuit control circuit 3 and the clock buffer control circuit 4 output, are set up as the power supply voltage decided by the above-mentioned processing (a-1) to (a-2). In this state, the expected value comparator circuit 6 controls the circuit block 1 so that the signal processing operation of circuit block 1 is implemented by the enough less frequency than the operation frequency demanded in the circuit block 1.

Next, in step S24, the expected value comparator circuit 6 compares the expected values. Here, the expected value comparing is processing similar to the above-mentioned expected value comparing. When the expected value comparator circuit 6 determines that the output value of the output terminals Douta and Doutb is not as the expected value, the flow of (a-1) to (a-2) is repeated.

The value of the power supply voltage decided thus is stored in a nonvolatile memory etc. included in the flip-flop control circuit 2, the combinational circuit control circuit 3 and the clock buffer control circuit 4, and the flip-flop control circuit 2, the combinational circuit control circuit 3 and the clock buffer control circuit 4 read the value of the desired power supply voltage from the nonvolatile memory etc. and apply it to the circuit block 1 in a real operation.

In addition, the nonvolatile memory etc. where the decided value of the power supply voltage is stored can achieve a similar effect even in the case where the nonvolatile memory etc. is provided outside each control circuit. Moreover, when there are plural operation frequencies demanded in the semiconductor integrated circuit, the procedure of (a-2) is repeated, the value decided respectively is stored in the nonvolatile memory etc., and the power supply voltage and the substrate voltage are supplied according to each operation frequency.

Moreover, since it is connected by the signal with different voltage amplitude between the flip-flop circuits FFa, FFb and FFc, and the combinational circuit 5, it is preferable to connect the level shifter between these different voltage amplitudes. Moreover, the decision flow of the power supply voltage is one example, and even if the power supply voltage is decided by other flow, a similar effect can be achieved.

(b) Optimization Processing of Substrate Voltage

FIG. 3 is a flow chart of processing for deciding the substrate voltage supplied by the flip-flop control circuit 2 and the combinational circuit control circuit 3 in the semiconductor integrated circuit of the configuration shown in FIG. 1.

(b-1) Processing for Optimizing Substrate Voltage of Flip-flop Control Circuit 2 in Order to Avoid Holding Error First of all, in step S31, after the power supply voltage, that the flip-flop control circuit 2, the combinational circuit control circuit 3 and the clock buffer control circuit 4 output, is set up as a standard value inherent in the use process, these circuits 2, 3 and 4 output the substrate voltage of 0, that is, the same voltage value as the power supply voltage, as the substrate voltage. Moreover, width of voltage fluctuation (Hereafter, it is called "variation width ($2_2$)") in controlling the substrate voltage, (Hereafter, it is called "substrate voltage (2)") that the flip-flop control circuit 2 outputs, by the variation adjustment described later, is reset as an initial variation width ($2_2$). The initial variation width ($2_2$) is set up as the enough high value compared with the voltage fluctuation of the substrate voltage (2) when the flip-flop control circuit 2 performs the stable operation. In order to detect the holding error in this state, the expected value comparator circuit 6 controls the circuit block 1 so that the signal processing operation of the circuit block 1 is implemented with the enough lower frequency than the operation frequency demanded in circuit block 1.

Next, in step S32, the expected value comparator circuit 6 compares the expected values.

Here, the expected value comparing is processing similar to the above-mentioned expected value comparing. When the expected value comparator circuit 6 determines that the output value of the output terminals Douta and Doutb is not as the expected value, it goes to step S33, and the substrate voltage (2) is changed into a negative direction by a factor of variation width ($2_2$). On the other hand, when the expected value comparator circuit 6 determines that the output value of the output terminals Douta and Doutb is as the expected value, it goes to step S34, and the substrate voltage (2) is changed into a positive direction by a factor of variation width ($2_2$). The variation width ($2_2$) becomes the initial variation width ($2_2$) at the first of the control.

Next, in step S35, it is determined whether or not the variation width (22) used in the processing of steps S33 and S34 is lower than or equal to the predetermined value (22). Here, the predetermined value ($2_2$) indicates the reference value for determining whether or not the variation width ($2_2$) is convergent as a result that the adjustments of the substrate voltage (2) progresses and then the substrate voltage (2) is stabilized.

In step S35, when it is determined that the variation width ($2_2$) is not less than or equal to the predetermined value ($2_2$), then, the variation width ($2_2$) is changed to half of the value in step S36.

Such expected value comparing flow is repeatedly executed until the variation width ($2_2$) becomes less than or equal to the predetermined value ($2_2$). Herewith, the substrate voltage (2) is set as an optimal value where the holding error is not occurred.

(b-2) Processing for Optimizing the Substrate Voltage of the Combinational Circuit Control Circuit 3 for Avoiding Setup Error Next, in step S37, the power supply voltage and the substrate voltage, that the flip-flop control circuit 2, the combinational circuit control circuit 3 and the clock buffer control circuit 4 output, is setup as the value (substrate voltage (2)) decided by the above-mentioned processing (b-1). Moreover, the width of voltage fluctuation (Hereafter, it is called "variation width ($3_2$)") in controlling the substrate voltage (Hereafter, it is called "substrate voltage (3)"), that the combinational circuit control circuit 3 outputs, through the variation adjustment described later, is reset as an initial variation width ($3_2$). In addition, the initial variation width ($3_2$) is set in the enough high value compared with the voltage fluctuation of the substrate voltage (3) when the combinational circuit control circuit 3 performs the stable operation. In order to detect the setup error in this state, the expected value comparator circuit 6 controls the circuit block 1 so that the signal processing operation is implemented with the frequency equal to the operation frequency demanded in the circuit block 1.

Next, in step S38, the expected value comparator circuit 6 compares the expected values. Here, the expected value comparing is processing similar to the above-mentioned expected value comparing. When the expected value comparator circuit 6 determines that the output value of the output terminals Douta and Doutb is not as the expected value, it goes to step S39, and the substrate voltage (3) is changed into a positive direction by a factor of variation width ($3_2$). On the other hand, when the expected value comparator circuit 6 determines that the output value of the output terminals Douta and Doutb is as the expected value, it goes to step S40, and the substrate voltage (3) is changed into a negative direction by a factor of variation width ($3_2$). The variation width ($3_2$) becomes the initial variation width ($3_2$) at the first of the control.

Next, in step S41, it is determined whether or not the variation width ($3_2$) used in the processing of steps S39 and S40 is less than or equal to the predetermined value ($3_2$). Here, the predetermined value ($3_2$) indicates the reference value for determining whether or not the variation width ($3_2$) is convergent as a result that the adjustment of the substrate voltage (3) progresses and then the substrate voltage (3) is stabilized.

In step S41, when it is determined that the variation width ($3_2$) is not less than or equal to the predetermined value ($3_2$), then, the variation width ($3_2$) is changed to half of the value in step S42.

Such expected value comparing flow is repeatedly executed until the variation width ($3_2$) becomes less than or equal to the predetermined value ($3_2$). Herewith, the substrate voltage (3) is set as the optimal value where the setup error is not occurred at the demanded operation frequency.

(b-3) Next, in step S43, the power supply voltage and the substrate voltage, that the flip-flop control circuit 2, the combinational circuit control circuit 3 and the clock buffer control circuit 4 output, is set up as the substrate voltage decided by the above-mentioned processing (b-1) to (b-2). Under such a condition, the signal processing operation is implemented at frequency lower than the frequency of operation demanded in the circuit block 1.

Next, in step S44, the expected value comparator circuit 6 compares the expected values. Here, the expected value comparing is processing similar to the above-mentioned expected value comparing. When the expected value comparator circuit 6 determines that the output value of the output terminals Douta and Doutb is not as the expected value, the flow of (b-1) to (b-2) is repeated.

The value of the substrate voltage decided thus is stored in a nonvolatile memory etc. included in the flip-flop control circuit 2, the combinational circuit control circuit 3 and the clock buffer control circuit 4, and then the flip-flop control circuit 2, the combinational circuit control circuit 3 and the clock buffer control circuit 4 read the value of the desired power supply voltage from the nonvolatile memory etc. and apply it to the circuit block 1 in a real operation.

In addition, the nonvolatile memory etc. where the decided value of the substrate voltage is stored can achieve a similar effect even if the nonvolatile memory etc. is provided outside each control circuit. Moreover, when there are plural operation frequencies demanded in the semiconductor integrated circuit, the procedure of (b-2) is repeated, the value decided respectively is stored in the nonvolatile memory etc., and the power supply voltage and the substrate voltage are supplied according to each operation frequency. In addition, the decision flow of the substrate voltage is one example, and even if the substrate voltage is decided by other flow, a similar effect can be achieved.

(c) Optimization of Power Supply Voltage and Substrate Voltage

FIG. 4 is a flow chart of processing for deciding the power supply voltage and the substrate voltage supplied in the flip-flop control circuit 2 and the combinational circuit control circuit 3 in the semiconductor integrated circuit with the configuration shown in FIG. 1.

(c-1) Processing for Optimizing Power Supply Voltage and Substrate Voltage of Flip-flop Control Circuit 2 for Avoiding Holding Error First of all, in step S51, after the power supply voltage, that the flip-flop control circuit 2, the combinational circuit control circuit 3 and the clock buffer control circuit 4 output, is set up as a standard value inherent in the use process, these circuits 2, 3 and 4 output the substrate voltage of 0, that is, the same voltage value as the power supply voltage, as the substrate voltage. Moreover, the width of voltage fluctuation (Hereafter, it is called "variation width ($2_3$)") in controlling the power supply voltage (Hereafter, it is called "power supply voltage (2)") and the substrate voltage (Hereafter, it is called "substrate voltage (2)"), that the flip-flop control circuit 2 outputs, through the variation adjustment described later is reset as an initial variation width ($2_3$). The initial variation width ($2_3$) is set in the enough high value compared with the voltage fluctuation of the power supply voltage (2) and the substrate voltage (2) under the stable operation of the flip-flop control circuit 2. In order to detect the holding error in this state, the expected value comparator circuit 6 controls the circuit block 1 so that the signal processing operation of the circuit block 1 is implemented by the enough lower frequency than the operation frequency demanded in circuit block 1.

Next, in step S52, the expected value comparator circuit 6 compares the expected values. Here, the expected value comparing is processing similar to the above-mentioned expected value comparing. When the expected value comparator circuit 6 determines that the output value of the output terminals Douta and Doutb is not as the expected value, it goes to step S53, and the power supply voltage (2) and the substrate voltage (2) are changed into a negative direction by a factor of variation width ($2_3$). On the other hand, when the expected value comparator circuit 6 determines that the operation is as the expected value, it goes to step S54, and the power supply voltage (2) and the power supply voltage (2) are changed into a positive direction by a factor of variation width ($2_3$).

Next, in step S55, it is determined whether or not the variation width ($2_3$) used in the processing of steps S53 and S54 is less than or equal to the predetermined value ($2_3$). Here, the predetermined value ($2_3$) indicates the value serving as a reference for determining whether or not the variation width ($2_3$) is convergent as a result that the adjustments of the power supply voltage (2) and the substrate voltage (2) progresses and then the power supply voltage (2) and the substrate voltage (2) is stabilized.

In step S55, when it is determined that the variation width ($2_3$) is not less than or equal to the predetermined value ($2_3$), then, the variation width ($2_3$) is changed to half of the value in step S56.

Such expected value comparing flow is repeatedly executed until the variation width ($2_3$) becomes less than or equal to the predetermined value ($2_3$). Herewith, the power supply voltage (2) and the substrate voltage (2) are set as optimal values where the holding error is not occurred.

In addition, it is preferable for the power supply voltage (2) and the substrate voltage (2) to be controlled as follows. That is, since the relation, where the total of the operating current and the leakage current is minimized, is uniquely decided, the power supply voltage (2) and the substrate voltage (2) are controlled to satisfy this relation (relation to which the total is minimized).

(c-2) Processing for Optimizing the Power Supply Voltage and the Substrate Voltage of the Combinational Circuit Control Circuit 3 for Avoiding Setup Error Next, in step S57, the power supply voltage and the substrate voltage, that the flip-flop control circuit 2, the combinational circuit control circuit 3 and the clock buffer control circuit 4 output, is set up as the value (power supply voltage (2) and substrate voltage (2)) decided by the above-mentioned processing (c-1). Moreover, the width of voltage fluctuation (Hereafter, it is called "variation width ($3_3$)") in controlling the power supply voltage (Hereafter, it is called "power supply voltage (3)") and the substrate voltage (Hereafter, it is called "substrate voltage (3)"), that the combinational circuit control circuit 3 outputs, through the variation adjustment described later is reset as an initial variation width ($3_3$). In addition, the initial variation width ($3_3$) is set in the enough high value compared with the voltage magnitude of the power supply voltage (3) and the substrate voltage (3) under a stable operation of the combinational circuit control circuit 3. In this state, the expected value comparator circuit 6 controls the circuit block 1 so that the signal processing operation is implemented at the frequency equal to the operation frequency demanded in the circuit block 1.

Next, in step S58, the expected value comparator circuit 6 compares the expected values. Here, the expected value comparing is processing similar to the above-mentioned expected value comparing. When the expected value comparator circuit 6 determines that the output value of the output terminals Douta and Doutb is not as the expected value, it goes to step S59, and the power supply voltage (3) and the substrate voltage (3) are changed into a positive direction by a factor of variation width ($3_3$). On the other hand, when the expected value comparator circuit 6 determines that the output value of the output terminals Douta and Doutb is as the expected value, it goes to step S60, and the power supply voltage (3) and the substrate voltage (3) are changed into a negative direction by a factor of variation width ($3_3$). The variation width ($3_3$) becomes the initial variation width ($3_3$) at the first of the control.

Next, in step S61, it is determined whether or not the variation width ($3_3$) used in the processing of steps S59 and S60 is less than or equal to the predetermined value ($3_3$). Here, the predetermined value ($3_3$) indicates the value serving as a reference for determining whether the variation width ($3_3$) is convergent as a result that the adjustment of the power supply voltage (3) progresses and then the power supply voltage (3) is stabilized.

In step S61, when it is determined that the variation width ($3_3$) is not less than or equal to the predetermined value ($3_3$), then, the variation width ($3_3$) is changed to half of the value in step S62.

Such expected value comparing flow is repeatedly executed until the variation width ($3_3$) becomes less than or equal to the predetermined value ($3_3$). Herewith, the power supply voltage (3) and the substrate voltage (3) are set as the optimal value where the setup error is not occurred at the demanded operation frequency.

(c-3) Next, in step S63, the power supply voltage and the substrate voltage, that the flip-flop control circuit 2, the combinational circuit control circuit 3 and the clock buffer control circuit 4 output, is set up as the value decided by the above-mentioned processing (c-1) to (c-2). In this state, the expected value comparator circuit 6 controls the circuit block 1 so that the signal processing operation of circuit block 1 is implemented at the enough lower frequency than the operation frequency from which the circuit block 1 is demanded.

Next, in step S64, the expected value comparator circuit 6 compares the expected values. Here, the expected value comparing is processing similar to the above-mentioned expected value comparing. When the expected value comparator circuit 6 determines that the output value of the output terminals Douta and Doutb is not as the expected value, the flow of (c-1) to (c-2) is repeated.

The values of the power supply voltage and the substrate voltage decided thus are stored in a nonvolatile memory etc. included in the flip-flop control circuit 2, the combinational circuit control circuit 3 and the clock buffer control circuit 4, and then the flip-flop control circuit 2, the combinational circuit control circuit 3 and the clock buffer control circuit 4 read the value of the desired power supply voltage from the nonvolatile memory etc. and apply it to the circuit block 1 in a real operation.

In addition, the nonvolatile memory etc. where the decided value is stored can achieve a similar effect even if the nonvolatile memory etc. is provided outside each control circuit. Moreover, when there are plural operation frequencies demanded in the semiconductor integrated circuit, the procedure of (c-2) is repeated, the value decided respectively is stored in the nonvolatile memory etc., and then the power supply voltage and the substrate voltage are supplied according to each operation frequency. In addition, since it is connected by the signal with different voltage amplitude between the flip-flop circuits FFa, FFb and FFc and the combinational circuit 5, it is preferable that the level shifter is connected between these different voltage amplitudes. Moreover, the decision flow of the power supply voltage and the substrate voltage is one example, and even if the power supply voltage and the substrate voltage are decided by other flow, a similar effect can be achieved.

Figure 5:
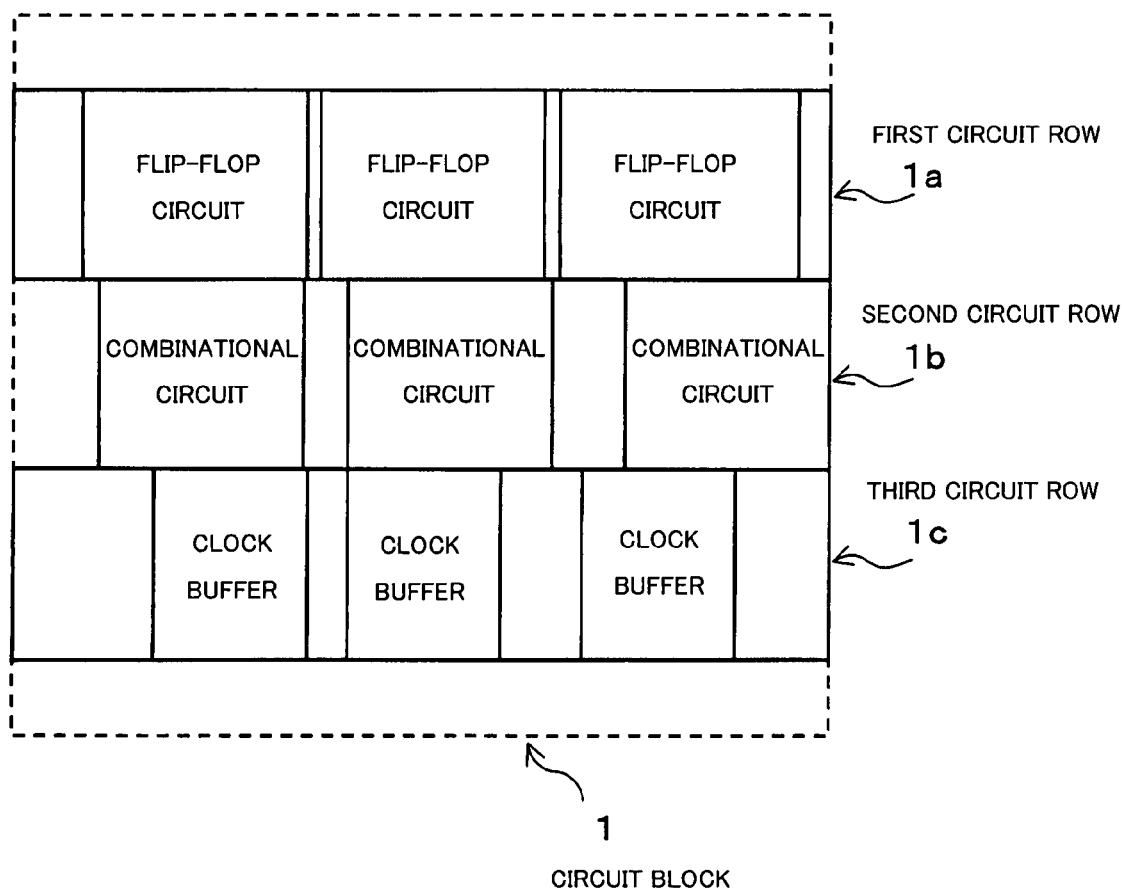
FIG. 5 is a layout configuration diagram according to the first embodiment of the present invention.

FIG. 5 is a layout configuration diagram of the circuit block 1 with the configuration shown in FIG. 1. The circuit block 1 comprises a plural circuit rows including a first circuit row 1a, a second circuit row 1b and a third circuit row 1c. In this plural circuit rows, the flip-flop circuit is arranged in the first circuit row 1a, the combinational circuit arranged in the second circuit row 1b, and the clock buffer arranged in the third circuit row 1c. As just described, it is possible to connect the power supply and the substrate with an optimal wiring, through arranging the circuit element wherein the same power supply voltage and the substrate voltage are set in each circuit row, which enables a resistance to decrease and enables a wiring resource to minimize.

Second Embodiment

Figure 6:
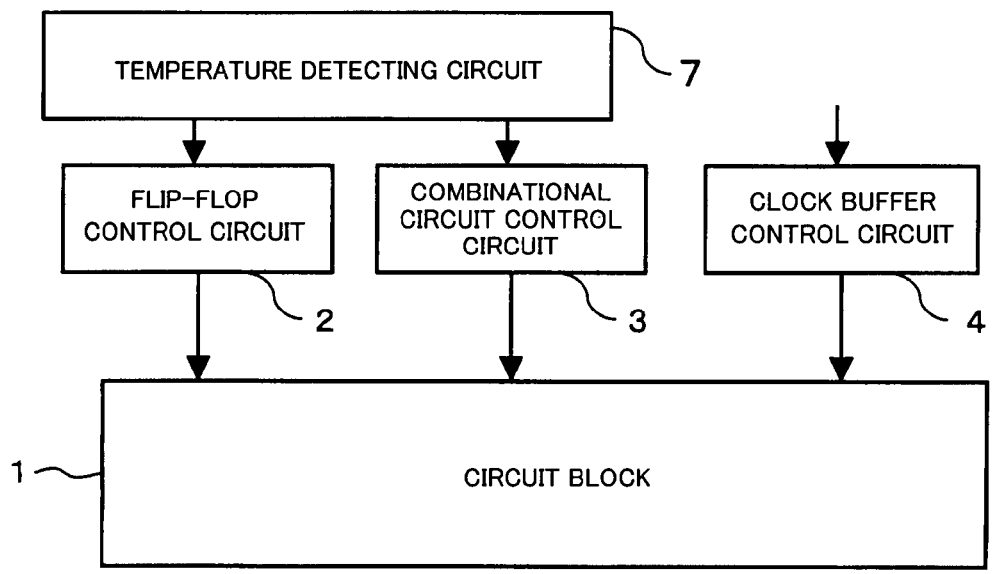
FIG. 6 is a block diagram showing a configuration of a semiconductor integrated circuit according to a second embodiment of the present invention.

Next, in the case where the semiconductor integrated circuit actually operates, described is a second embodiment where the present invention is implemented in a configuration wherein the delay time of the flip-flop circuits FFa, FFb and FFc and the combinational circuit 5 varies due to change of temperature and voltage and degradation in the process etc. As shown in FIG. 6, the semiconductor integrated circuit is equipped with the circuit block 1, the flip-flop control circuit 2, the combinational circuit control circuit 3, the clock buffer control circuit 4 and a temperature detecting circuit 7. The temperature detecting circuit 7 detects temperature, and controls the flip-flop control circuit 2 and the combinational circuit control circuit 3 based on the detected signal.

In the case where the temperature changes when the semiconductor integrated circuit is operated, threshold voltage of the transistor and delay time due to the wiring change. In order to prevent glitch of the semiconductor integrated circuit due to this temperature change, a relational expression between the temperature change and the power supply voltage and the substrate voltage is created in advance. And then, one or both of the power supply voltage and the substrate voltage of the flip-flop control circuit 2 and the combinational circuit control circuit 3 is controlled on the basis of the above-mentioned relational expression according to the variation of the temperature.

For example, as for the semiconductor integrated circuit, when it is constituted with the process where the delay grows when the temperature rises, it is highly possible that the setup error is occurred if the temperature rises. Consequently, the setup error can be avoided by decreasing the delay time through implementing one or both of the following methods according to rising of the temperature:
the power supply voltage of the flip-flop control circuit 2 and the combinational circuit control circuit 3 is increased; and
the substrate voltages of these circuits 2 and 3 are changed so as to shift to the positive direction.

On the other hand, it is highly possible that the holding error is occurred if the temperature decreases. Therefore, the holding error can be avoided by increasing the delay time by implementing one or both of the following methods according to the amount of declination of the temperature:
the power supply voltage of the flip-flop control circuit 2 and the combinational circuit control circuit 3 is decreased; and
the substrate voltages of these circuits 2 and 3 are changed so as to shift to the negative direction. In addition, the temperature detecting circuit 7 can achieve a similar effect even when it is provided outside of the semiconductor integrated circuit.

Third Embodiment

Figure 7:
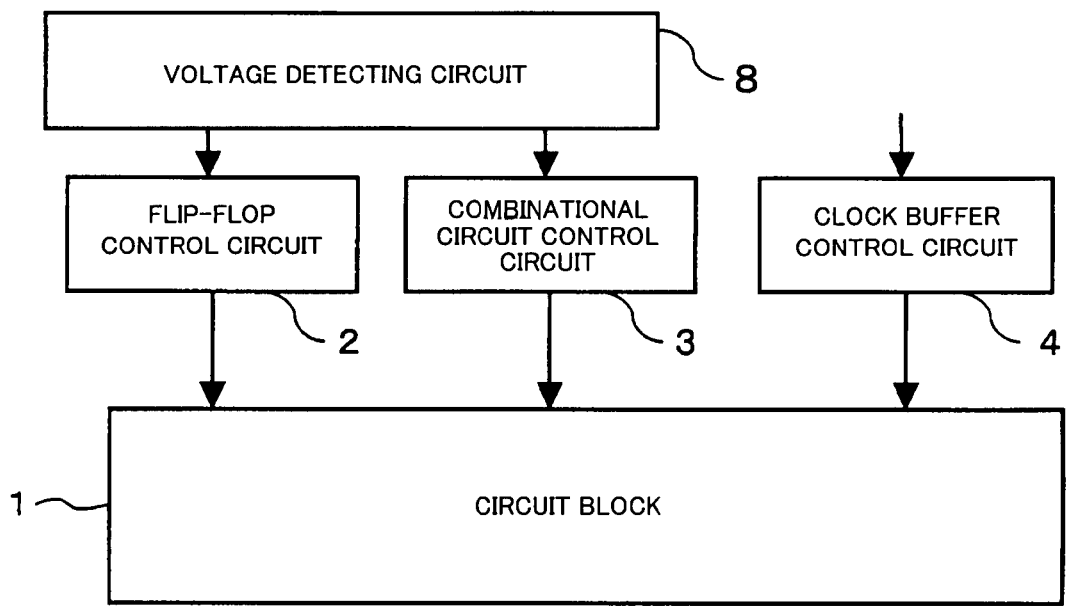
FIG. 7 is a block diagram showing a configuration of a semiconductor integrated circuit according to a third embodiment of the present invention.

As shown in FIG. 7, the semiconductor integrated circuit is equipped with the circuit block 1, the flip-flop control circuit 2, the combinational circuit control circuit 3, the clock buffer control circuit 4 and a voltage detecting circuit 8. The voltage detecting circuit 8 controls the flip-flop control circuit 2 and the combinational circuit control circuit 3 based on a detection signal after the voltage is detected. Hereinafter, it is explained in detail.

When the voltage changes when the semiconductor integrated circuit is operated, the threshold voltage of the transistor and the delay time due to the wiring change. A table indicating a relational expression between the voltage change and the power supply voltage and the substrate voltage is created in advance, so that malfunction of the semiconductor integrated circuit does not occur due to this voltage change. And then, one or both of the following is controlled on the basis of the result of referring to amount of change in voltage with the above mentioned table:
power supply voltages of the circuits 2 and 3; and
substrate voltages of the circuits 2 and 3.

For example, as for the semiconductor integrated circuit, it is highly possible that the setup error is occurred if the voltage drops. Then, the setup error can be avoided by decreasing delay time through taking the following method, according to the dropping amount of the voltage:
the substrate voltages of the flip-flop control circuit 2 and the combinational circuit control circuit 3 are changed so as to shift to the positive direction.

On the other hand, it is highly possible that the holding error is occurred if the voltage rises. Then, the setup error can be avoided by increasing delay time through taking the following method, according to the rise amount of the voltage:
the substrate voltages of the flip-flop control circuit 2 and the combinational circuit control circuit 3 are changed so as to shift to the negative direction. In addition, a similar effect can be achieved even when the voltage detecting circuit 8 is provided outside of the semiconductor integrated circuit.

Fourth Embodiment

Figure 8:
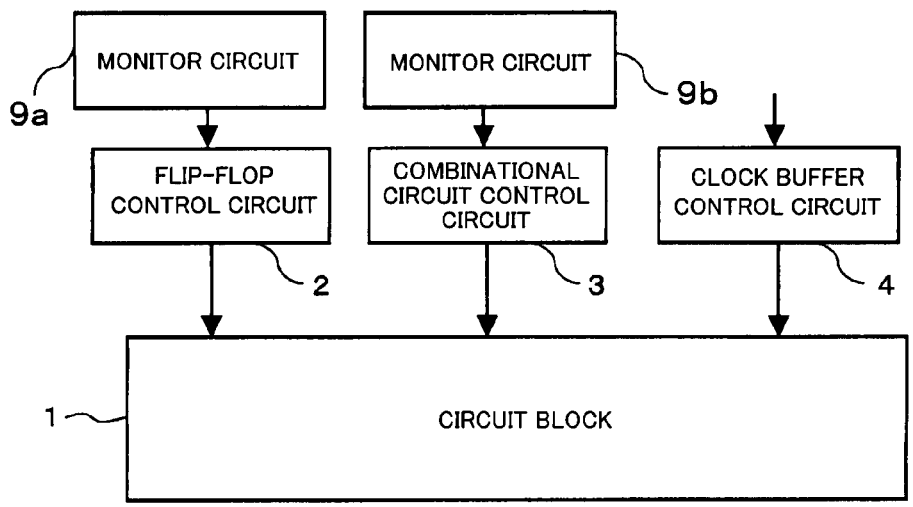
FIG. 8 is a block diagram showing a configuration of a semiconductor integrated circuit according to a fourth embodiment of the present invention.

As shown in FIG. 8, the semiconductor integrated circuit is equipped with the circuit block 1, the flip-flop control circuit 2, the combinational circuit control circuit 3, the clock buffer control circuit 4 and monitor circuits 9a and 9b. The monitor circuits 9a and 9b are consisting of the single transistor, the power supply voltage and the substrate voltage of the monitor circuit 9a are supplied by the flip-flop control circuit 2, and the power supply voltage and the substrate voltage of the monitor circuit 9b are supplied by the combinational circuit control circuit 3.

When voltage fluctuation and temperature fluctuation are occurred, the output value (electric current etc.) of the monitor circuits 9a and 9b (single transistor) changes. Then, the delay due to voltage fluctuation and the temperature fluctuation can be controlled through making the saturation current at that time constant. For example, when it is detected that the saturation current of monitor circuit 9a is decreasing, the setup error can be avoided by decreasing the delay time through implementing one or both of the following methods:
the power supply voltage of the flip-flop control circuit 2 is increased; and
the substrate voltage of circuit 9a is changed so as to shift to the positive direction.

On the other hand, when it is detected that the saturation current of monitor circuit 9a is increasing, the setup error can be avoided by increasing the delay time through implementing one or both of the following methods:
the power supply voltage of the flip-flop control circuit 2 is decreased; and the substrate voltage of circuit 9a is changed so as to shift to the negative direction. In addition, the monitor circuit 9b and the combinational circuit control circuit 3 can be similarly controlled.

Fifth Embodiment

Figure 9:
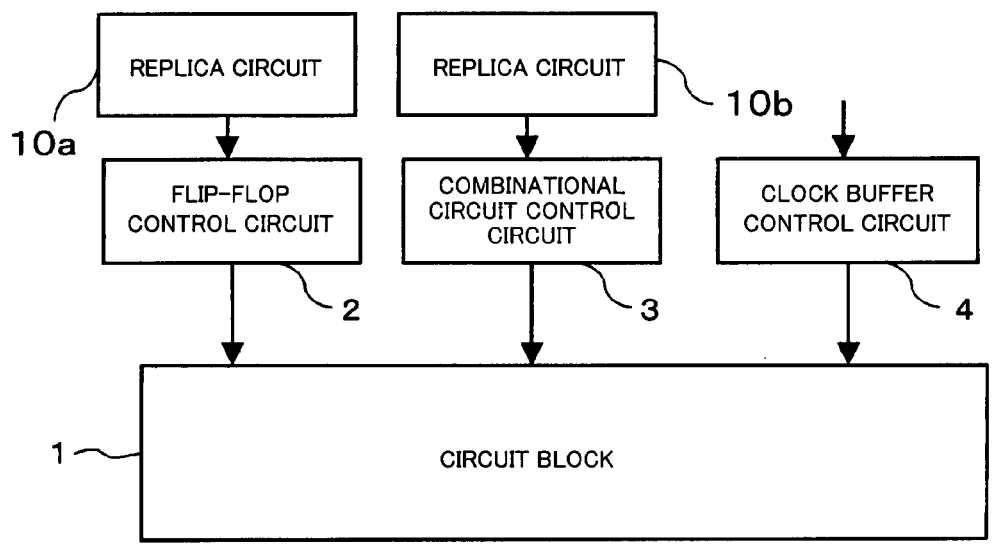
FIG. 9 is a block diagram showing a configuration of a semiconductor integrated circuit according to a fifth embodiment of the present invention.

As shown in FIG. 9, the semiconductor integrated circuit is equipped with the circuit block 1, the flip-flop control circuit 2, the combinational circuit control circuit 3, the clock buffer control circuit 4 and replica circuits 10a and 10b. One or more paths where the hold restriction value is the strictest are arranged in the replica circuit 10a. One or more paths where the setup restriction value is the strictest are arranged in the replica circuit 10b. The power supply voltage and the substrate voltage of the replica circuit 10a are supplied through the flip-flop control circuit 2. The power supply voltage and the substrate voltage of the replica circuit 10b are supplied through the combinational circuit control circuit 3.

The delay time of the replica circuits 10a and 10b changes when voltage fluctuation and temperature fluctuation are occurred. Then, the influence of voltage fluctuation and temperature fluctuation can be controlled through making this delay time constant. For example, when it is detected that the delay time of the replica circuit 10a is increasing, the setup error can be avoided by decreasing the delay time through implementing one or both of the following methods:
the power supply voltage of the flip-flop control circuit 2 is increased; and
the substrate voltage of circuit 10a is changed so as to shift to the positive direction.
On the other hand, when it is detected that the delay time of the replica circuit 10a is decreasing, the setup error can be avoided by increasing the delay time through implementing one or both of the following methods:
the power supply voltage of the flip-flop control circuit 2 is decreased; and
the substrate voltage of circuit 10a is changed so as to shift to the negative direction. In addition, the replica circuit 10b and the combinational circuit control circuit 3 can be similarly controlled.

Sixth Embodiment

As shown in FIG. 10, the semiconductor integrated circuit is equipped with the circuit block 1, the flip-flop control circuit 2, the combinational circuit control circuit 3, the clock buffer control circuit 4 and a stop signal generation circuit 11. The stop signal generation circuit 11 is a circuit that generates a control signal for stopping the operation of the circuit block 1. When this control signal becomes active, the clock in the circuit block 1 stops and it becomes a state where the value of the flip-flop circuit is held. In order to reduce the consumption current due to the leakage current of the transistor in this state, the leakage current of the flip-flop circuit can be reduced by implementing the following armature-voltage controls:
the power supply voltage of the flip-flop control circuit 2 is held to the same electrical potential as the operating state;
the power supply voltage of the combinational circuit control circuit 3 and the power supply voltage of the clock buffer control circuit 4 are held to the earth potential; and
the substrate voltage of the flip-flop control circuit 2 is changed so as to shift to the negative direction.
Herewith, it is possible to achieve low power consumption in the stopped state of operation. In addition, the stop signal generation circuit 11 can achieve a similar effect even when it is provided outside of the semiconductor integrated circuit.

Seventh Embodiment

Figure 11A:
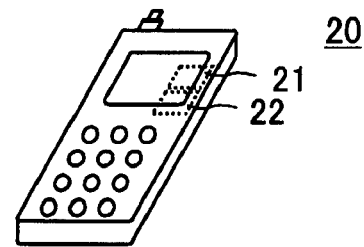
FIG. 11A to FIG. 11E are overview diagrams of a communication device, an information player, a picture display unit, an electronic apparatus, and a mobile object, including the semiconductor integrated circuit of the present invention.

FIG. 11A shows a general view of a mobile phone 20 that is one example of the communication device including the semiconductor integrated circuit according to the present invention. The mobile phone 20 includes baseband LSI 21 and application LSI 22. The baseband LSI 21 and the application LSI 22 are the semiconductor integrated circuits having the technical content of the present invention. Since this semiconductor integrated circuit can be operated with power consumption less than conventional, the baseband LSI 21, the application LSI 22 and the mobile phone 20 including them can be also operated with low power consumption. Further, also as for anything other than the baseband LSI 21 and application LSI 22, that is a semiconductor integrated circuit included in the mobile phone 20, the effect similar to the above-mentioned can be achieved by similarly constituting the logic circuit included in the aforementioned semiconductor integrated circuit.

In addition, such a communication device is not limited to the mobile phone. Except for this, for example, a transmitter and a receiver in communication system, and a modem device etc. that performs the data transmission are contained. By configuring like this, the effect of reducing the power supply consumption can be achieved with respect to all communication devices, regardless of the cable and the wireless, and the optical communication and telecommunication, and regardless of the digital method and the analog method.

Figure 11B:
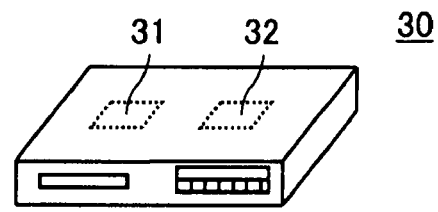

FIG. 11B shows a general view of an optical disk device 30 that is one example of an information player including the semiconductor integrated circuit according to the present invention. The optical disk device 30 includes a media signal processing LSI 31 that processes a signal read from the optical disc, and an error correction/servo processing LSI 32 performs the error correction of the signal and servo control of the optical pick-up. The media signal processing LSI 31 and the error correction/servo processing LSI 32 are the semiconductor integrated circuits having the technical content of the present invention. Since this semiconductor integrated circuit can be operated under power consumption less than conventional, the media signal processing LSI 31, the error correction/servo processing LSI 32 and the optical disk device 30 including the media signal processing LSI 31 and the error correction/servo processing LSI 32 can be also operated under low power consumption. Further, also as for a semiconductor integrated circuit, that is included in the optical disk device, other than the media signal processing LSI 31 and the error correction/servo processing LSI 32, the effect similar to the above-mentioned can be achieved through taking similarly configuration of the logic circuit included in the relevant semiconductor integrated circuit.

In addition, such a communication device is not limited to the optical disk device. Except for this, for example, a video reproduction apparatus with a built-in magnetic disk, an information record player having a semiconductor memory as a medium, and the like, are contained. By configuring like this, the effect of reducing the power consumption can be achieved with respect to all information players (the information record function may be included) regardless of any kind of the media where information is recorded.

Figure 11C:
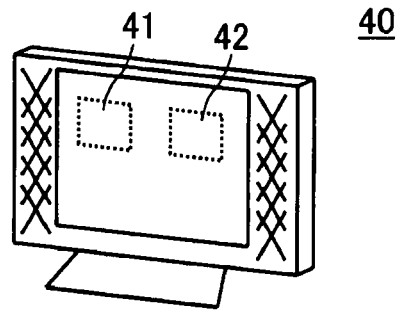

FIG. 11C shows a general view of a television receiver 40 that is one example of a video display unit including the semiconductor integrated circuit according to the present invention. The television receiver 40 comprises a video/audio processing LSI 41 that processes a video signal and an audio signal, and a display/sound source control LSI 42 that controls devices such as display screens and speakers. The video/audio processing LSI 41 and the display/sound source control LSI 42 are the semiconductor integrated circuits having the technical content of the present invention. Since this semiconductor integrated circuit can be operated under power consumption less than conventional, the video/audio processing LSI 41, the display/sound source control LSI 42, and the television receiver 40 including the video/audio processing LSI 41 and the display/sound source control LSI 42, can be also operated under low power consumption. Further, anything, that is a semiconductor integrated circuit included in the television receiver 40, other than the video/audio processing LSI 41 and the display/sound source control LSI 42, the effect similar to the above-mentioned can be achieved by taking similar configuration of the logic circuit included in the relevant semiconductor integrated circuit.

In addition, such a video display unit is not limited to the television receiver. Except for this, for example, an apparatus that displays streaming data delivered through electric telecommunication lines is contained. By configuring like this, the effect of reducing the power consumption can be achieved with respect to all video display units regardless of the method for transmitting information.

Figure 11D:
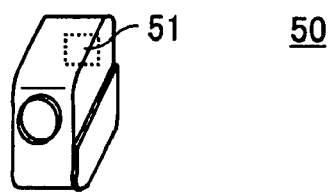

FIG. 11D shows a general view of a digital camera 50 that is one example of an electronic apparatus including the semiconductor integrated circuit according to the present invention. The digital camera 50 includes a signal processing LSI 51 that is the semiconductor integrated circuit having the technical content of the present invention. Since the semiconductor integrated circuit according to the present invention can be operated under power consumption less than conventional, the signal processing LSI 51 and the digital camera 50 including the signal processing LSI 51 can be also operated under low power consumption. Further, also as for a semiconductor integrated circuit included in the digital camera 50, other than the signal processing LSI 51, the effect similar to the above-mentioned can be achieved by taking similar configuration of the logic circuit included in the relevant semiconductor integrated circuit.

In addition, such an electronic apparatus is not limited to the digital camera. Except for this, for example, the general apparatus including the semiconductor integrated circuit such as various sensor equipment and electric computer is contained. By configuring like this, the effect of the power reducing of the all-around electronic apparatus can be achieved.

Figure 11E:
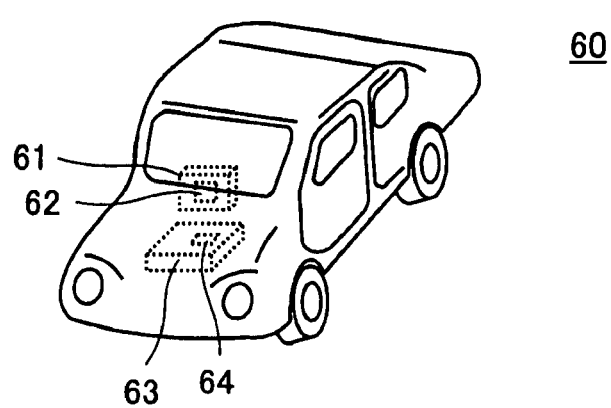

FIG. 11E shows a general view of an electronic controller including the semiconductor integrated circuit of the present invention, and an automobile 60 that is one example of a movable body including the electronic controller. The automobile 60 includes an electronic controller 61. The electronic controller 61 is a semiconductor integrated circuit having the technical content of the present invention, and includes a transmission control LSI 62 for controlling an engine and a transmission etc. of the automobile 60. Moreover, the automobile 60 includes a navigation apparatus 63. The navigation apparatus 63 also includes a navigation LSI 64 that is the semiconductor integrated circuit having the technical content of the present invention as well as the electronic controller 61.

Since the semiconductor integrated circuit according to the present invention can be operated under power consumption less than conventional, the transmission control LSI 62 and the electronic controller 61 including the transmission control LSI 62, can be also operated under low power consumption. Similarly, it can be operated under low power consumption as for the navigation LSI 64 and the navigation apparatus 63 including this navigation LSI 64. Further, as for a semiconductor integrated circuit included in the electronic controller 61, other than the transmission control LSI 62, the effect similar to the above-mentioned can be achieved by taking similar configuration of the logic circuit included in the relevant semiconductor integrated circuit. As for the navigation apparatus 63, it can be described similarly. And then, the power consumption in the automobile 60 can be reduced through reduction of the power consumption in the electronic controller 61.

In addition, such an electronic controller is not limited to the thing that controls the above-mentioned engine and transmission. Except for this, for example, the general apparatus, that includes the semiconductor integrated circuit such as motor control device, for controlling the power source, is contained. The effect of reducing the power consumption in the electronic controller can be achieved through configuring like this.

In addition, such a mobile object including the semiconductor integrated circuit according to the present invention is not limited to the automobile. Except for this, for example, the general apparatus such as trains and airplanes including the electronic controller for controlling the engine and the motor etc. that are the power sources, is contained. The effect of reducing the power in the movable body can be achieved by configuring like this. In addition, the present invention is not limited to the above-mentioned embodiments, and of course it is possible to change variously within the range where it does not deviate from the content.

Although the most preferable concrete example about this invention was explained in detail, the combination and the array of parts of the preferred embodiment can change variously without contradicting within the spirit and the range of this invention claimed later.

What is claimed is:

1. A semiconductor integrated circuit comprising:
    a flip-flop circuit;
    a combinational circuit connected to the flip-flop circuit;
    a clock buffer for supplying a clock to the flip-flop circuit; and
    a control circuit for mutually controlling a CKQ delay time of the flip-flop circuit and a delay time of the combinational circuit independently, wherein the CKQ delay time is a time between when an output signal of the flip-flop circuit changes and an edge of the clock supplied to the flip-flop circuit by the clock buffer.

2. The semiconductor integrated circuit according to claim 1, wherein
    when an operation result in a state, where the flip-flop circuit and the combinational circuit are operated at enough low frequency from a clock frequency, is different from an expected value, the control circuit controls the CKQ delay time of the flip-flop circuit so that the CKQ delay time of the flip-flop circuit becomes long.

3. The semiconductor integrated circuit according to claim 1, wherein
    when an operation result in a state, where the flip-flop circuit and the combinational circuit are operated at a clock frequency, is different from an expected value, the control circuit controls the delay time of the combinational circuit so that the delay time of the combinational circuit becomes short.

4. The semiconductor integrated circuit according to claim 1, wherein
    the control circuit controls the CKQ delay time of the flip-flop circuit and the delay time of the combinational circuit, based on a substrate voltage control.

5. The semiconductor integrated circuit according to claim 1, wherein
the control circuit controls the CKQ delay time of the flip-flop circuit and the delay time of the combinational circuit, based on a power supply voltage control.

6. The semiconductor integrated circuit according to claim 1, further comprising
a first circuit row, a second circuit row and a third circuit row arranged in parallel with one another sequentially, wherein:
the flip-flop circuit is provided in the first circuit row;
the combinational circuit is provided in the second circuit row; and
the clock buffer is provided in the third circuit row.

7. The semiconductor integrated circuit according to claim 1, further comprising
a temperature detecting circuit for adjusting the control circuit depending on a variation of a circuit temperature of a relevant semiconductor integrated circuit.

8. The semiconductor integrated circuit according to claim 1, further comprising
a voltage detecting circuit for adjusting the control circuit depending on an amount of voltage alteration of a relevant semiconductor integrated circuit.

9. The semiconductor integrated circuit according to claim 1, further comprising
a monitor circuit for adjusting the control circuit so that an amount of a current of a relevant semiconductor integrated circuit is constant.

10. The semiconductor integrated circuit according to claim 1, further comprising
a replica circuit for adjusting the control circuit so that a delay time of a relevant semiconductor integrated circuit is constant.

11. The semiconductor integrated circuit according to claim 1, further comprising
a stop signal generation circuit for controlling the control circuit so that a negative substrate voltage is applied to the flip-flop circuit when the flip-flop circuit becomes a state where operation is stopped.

12. The semiconductor integrated circuit according to claim 1, further comprising
a stop signal generation circuit for controlling the control circuit so that an earth potential is applied to a power supply voltage of the combinational circuit and a power supply voltage of the clock buffer when the combinational circuit and the clock buffer become a state where operation is stopped.

13. A communication device comprising a baseband LSI, wherein
the baseband LSI comprises the semiconductor integrated circuit according to claim 1.

14. An information reproducing apparatus comprising a signal processing LSI for treating a signal read from a recording medium, wherein
the signal processing LSI comprises the semiconductor integrated circuit according to claim 1.

15. A video display apparatus comprising a signal processing LSI for treating a signal including a video signal, wherein
the signal processing LSI comprises the semiconductor integrated circuit according to claim 1.

16. An electronic apparatus comprising a signal processing LSI for treating a signal in an input signal, wherein
the signal processing LSI comprises the semiconductor integrated circuit according to claim 1.

17. An electronic control apparatus comprising a control LSI for treating a signal in a control signal that controls a control object, wherein
the control LSI comprises the semiconductor integrated circuit according to claim 1.

18. A movable body comprising an electronic control apparatus for controlling a drive system, wherein
the electronic control apparatus comprises the semiconductor integrated circuit according to claim 1.

19. The semiconductor integrated circuit according to claim 1, wherein the edge of the clock is a rising edge of the clock.

* * * * *